(12) United States Patent
Wernlund et al.

(10) Patent No.: US 7,433,606 B2
(45) Date of Patent: Oct. 7, 2008

(54) PHOTODIODE BIAS CONTROLLER FOR OPTICAL RECEIVER

(75) Inventors: James V. Wernlund, Indialantic, FL (US); Brandon W. Stark, Palm Bay, FL (US)

(73) Assignee: JDS Uniphase Corporation, Milpitas, CA (US)

( * ) Notice: Subject to any disclaimer, the term of this patent is extended or adjusted under 35 U.S.C. 154(b) by 523 days.

(21) Appl. No.: 11/166,599

(22) Filed: Jun. 24, 2005

(65) Prior Publication Data

US 2005/0286910 A1     Dec. 29, 2005

Related U.S. Application Data

(60) Provisional application No. 60/583,583, filed on Jun. 28, 2004.

(51) Int. Cl.
*H04B 10/06* (2006.01)
*G01J 1/44* (2006.01)

(52) U.S. Cl. .................. 398/202; 398/213; 250/214 R

(58) Field of Classification Search .............. 398/202, 398/213; 250/214 AG, 214 C, 214 R; 323/222
See application file for complete search history.

(56) References Cited

U.S. PATENT DOCUMENTS

| | | | |
|---|---|---|---|
| 6,380,718 B1* | 4/2002 | Davis et al. .................. 322/28 |
| 6,658,583 B1 | 12/2003 | Kudo et al. .................. 713/500 |
| 6,741,436 B2 | 5/2004 | Gilbert et al. ................ 361/18 |
| 6,747,778 B2 | 6/2004 | Brown et al. ................. 359/264 |
| 7,217,914 B2* | 5/2007 | Stewart et al. ............ 250/214 R |
| 2002/0043614 A1 | 4/2002 | Miyamoto et al. .......... 250/214 |
| 2002/0190768 A1 | 12/2002 | Bowling ..................... 327/175 |
| 2003/0122533 A1* | 7/2003 | Prescott ...................... 323/313 |
| 2003/0210917 A1 | 11/2003 | Stewart et al. .............. 398/209 |
| 2004/0129863 A1 | 7/2004 | Cheung et al. .............. 250/214 |
| 2004/0159776 A1 | 8/2004 | Richard et al. ............. 250/214 |

OTHER PUBLICATIONS

Microchip AN564 PWM Microcontroller. Datasheet [online]. Microchip Technology Inc., 1997 [retrieve Jan. 18, 2008]. Retrieved from the Internet: <URL: ww1.microchip.com/downloads/en/AppNotes/00564b.pdf>.*

* cited by examiner

*Primary Examiner*—Jason Chan
*Assistant Examiner*—Nathan M Curs
(74) *Attorney, Agent, or Firm*—Allen, Dyer, Doppelt, Milbrath & Gilchrist, P.A.

(57) ABSTRACT

A method of, and an apparatus for, biasing photodiodes used in optical receivers or optical transceivers includes an electronic circuit for generating a bias voltage for the photodiode and a processor having a pulse-width modulation unit that produces pulse-width modulated pulses at a predetermined number of duty cycle values M. The processor is coupled to the electronic circuit such that a magnitude of the bias voltage is dependent upon a duty cycle value of at least one of the pulse-width modulated pulses. Advantageously, the processor includes a program for modulating the pulse-width modulated pulses generated by the processor between two different duty cycle values such that a number of obtainable bias voltages is greater than M. The result is a significant reduction in the number of necessary components.

17 Claims, 3 Drawing Sheets

Case 1

$V_{DC} = 2/16$

Case 2

$V_{DC} = 3/16$

PHOTODIODE BIAS CONTROLLER FOR OPTICAL RECEIVER

CROSS-REFERENCE TO RELATED APPLICATIONS

This application claims the benefit of U.S. Provisional Application No. 60/583,583, filed Jun. 28, 2004, the contents of which are incorporated by reference herein.

MICROFICHE APPENDIX

Not Applicable.

TECHNICAL FIELD

The present application relates generally to biasing photodiodes and more particularly to a method of, and an apparatus for, biasing photodiodes used in optical transceivers and/or optical receivers using modulated processor PWM.

BACKGROUND OF THE INVENTION

Photodiodes are widely used in optical communications systems for the detection of optical signals. In particular, photodiodes are often included in optical transceivers and/or optical receivers for detecting the optical signals that are to be converted into electrical signals. The two most commonly used photodiodes for these applications include the p-material-intrinsic-layer-n-material (PIN) photodiode and the avalanche photodiode (APD).

While PIN photodiodes and APDs both ultimately accomplish the same result, namely the conversion of a received optical signal to an electrical signal, APDs use the avalanche phenomenon to produce an amplified electrical signal and thus are more suited for use in low, weak, or reduced light applications. This increased sensitivity, however, is achieved at the expense of having to provide a relatively high reverse bias voltage. For example, while PIN photodiodes often require reverse bias voltages between 5 and 20 V, APDs often require reverse bias voltages between 30 and 90 V.

The relatively high reverse bias voltage required for APDs is generated and controlled by a high voltage bias circuit. The high voltage bias circuit is essentially a DC-DC converter, which converts a low input voltage (e.g., less than about 5V) to a higher output voltage (e.g., from about 30V to 90V) using minimal current from the power generator.

FIG. 1 illustrates one example of a typical high voltage bias circuit. The high voltage bias circuit 100 includes a pulse-width modulated (PWM) chip 110, a field effect transistor (FET) switch Q1, an inductor L1, a diode D1, resistors R1, R2, and R3, capacitors C1 and C2, and a high voltage (HV) current monitor 120. When the FET Q1 is switched on, energy is stored in the inductor L1, while the diode D1 prevents the capacitor C1 from discharging to ground. When the FET Q1 is switched off, a voltage reversal is induced so that the energy stored in the inductor L1 is discharged, passes through the diode, and is transferred to the capacitor C1. As multiple cycles are completed, additional charge is built up on the capacitor C1 until a limited amount of current is supplied at the higher voltage $V_{APD}$. The circuit including Q1, L1, D1, and C1 is commonly referred to as a flyback circuit because the induced voltage reversal causes a "flyback" or "kickback" effect in the inductor L1. The PWM chip 110 is used to control the flyback action by providing a stream of pulses in which the pulse-width is modulated, thus maintaining a constant switching frequency. A feedback loop including resistor divider R2, R3 provides feedback needed to determine the duty cycle of the stream of pulses in order to control and regulate the output voltage $V_{APD}$. The HV current monitor 120 is provided to monitor the APD's average current, which is proportional to the optical signal strength. Typically, the current monitor 120 includes a sense resistor.

FIG. 2 illustrates another example of a high voltage bias circuit. The high voltage circuit 200 includes an external pulse generator 210, transistors Q1 and Q2, an inductor L1, diodes D1 and D2, capacitors C1 and C2, resistors R1, R2, R3, and R4, high voltage differential amplifier 220, and a current monitor 230. When the FET Q1 is switched on, energy is stored in the inductor L1, while the diode D1 prevents the capacitor C1 from discharging to ground. When the FET Q1 is switched off, a voltage reversal is induced so that the energy stored in the inductor L1 is discharged, passes through the diode D1, and is transferred to the capacitor C1. As multiple cycles are completed, additional charge is built up on the capacitor C1 and a limited amount of current is supplied at the higher voltage $V_{APD}$. The circuit including Q1, L1, D1, and C1 is commonly referred to as a flyback circuit because the induced voltage reversal results in the "flyback" or "kickback" effect provided by the inductor L1. The circuit including Q2, D2, R2, R3, R4, $V_{REF}$, and the difference amplifier 220, serves as a shunt feedback loop. While the pulse generator 210 is used to induce the flyback effect by providing a stream of pulses, it is the shunt feedback loop that actually controls and regulates the output voltage $V_{APD}$. The HV current monitor 230 is provided to monitor the APD's average current, which is proportional to the optical signal strength. Typically, the current monitor 230 includes a sense resistor.

In practice, high voltage bias circuits, such as those shown in FIGS. 1 and 2, are external to the APD receiver and/or transceiver module that they control. For example, as shown in FIG. 3, a typical optical receiver 300 includes control circuitry 310 coupled to an APD receiver module 320. The APD receiver module 320 includes the APD 322, which converts the optical signal received from the optical input into an electric current, and an equalizing amplifier 326, which converts the electric current into a voltage. The control circuitry 310, which drives the APD 322, includes a high voltage bias circuit similar to that illustrated in either of FIGS. 1 and 2. For illustrative purposes, the high voltage circuit is shown broken down into two discrete parts, namely, a HV power supply and a current monitor. As shown in FIGS. 1, 2, and 3 it is preferred that the current monitor be mounted on the high side of the HV power supply. The HV current monitor is provided to monitor the APD's average current, which is proportional to the optical signal strength of an optical signal sensed at by the APD. The control circuitry 310 also includes a microprocessor coupled to the HV power supply. The microprocessor provides the reference voltage $V_{REF}$ and optionally provides corrections for the APD's temperature dependent response.

It is an object of the instant invention to provide a high voltage bias circuit for optical transceivers and/or receivers with a reduced number of components.

It is another object of the instant invention to provide a high voltage bias circuit for optical transceivers and/or receivers with increased resolution and/or increased power monitoring.

SUMMARY OF THE INVENTION

The instant invention provides a method of, and an apparatus for, biasing photodiodes used in optical transceivers and/or optical receivers using a high voltage bias circuit having a reduced number of components.

The reduction in the number of components is accomplished by recognizing that many microprocessors, which are typically part of the control circuitry used to drive the photodiode, include an on-chip PWM unit with an output that is a source of PWM pulses. These processor PWM pulses are used to drive the high bias circuit of the instant invention in lieu of a discrete PWM chip or external pulse generator. Increased resolution is provided by further modulating the processor PWM pulses.

The reduction in the number of components is further achieved by recognizing that the microprocessor is also able to perform current monitoring. More specifically, the microprocessor provides improved current/power monitoring by monitoring the average width of the modulated processor PWM pulses.

In accordance with one aspect of the instant invention there is provided a method of biasing a photodiode used in an optical receiver or optical transceiver comprising: coupling the photodiode to an electronic circuit, the electronic circuit controlled by a processor that produces pulse-width modulated pulses at a predetermined number of duty cycle values M; generating a bias voltage using the electronic circuit by modulating pulse-width modulated pulses generated by the processor between two different duty cycle values such that a number of obtainable bias voltages is greater than M.

In accordance with another aspect of the instant invention there is provided an apparatus for biasing a photodiode used in an optical receiver or optical transceiver comprising: an electronic circuit for generating a bias voltage for the photodiode, the bias voltage higher than an input voltage; and a processor including a pulse-width modulation unit that produces pulse-width modulated pulses at a predetermined number of duty cycle values M, the processor coupled to the electronic circuit such that a magnitude of the bias voltage is dependent upon a duty cycle value of at least one of the pulse-width modulated pulses, the processor including a program for modulating the pulse-width modulated pulses generated by the processor between two different duty cycle values such that a number of obtainable bias voltages is greater than M.

In accordance with another aspect of the instant invention there is provided an apparatus for biasing a photodiode used in an optical receiver or optical transceiver comprising: an input node for providing an input voltage; electronic circuitry coupled to the input node for generating a bias voltage that is higher than the input voltage, the electronic circuitry controlled by a processor that has a pulse-width modulated output, the pulse-width modulated output including a first train of pulse-width modulated pulses and a second train of pulse-width modulated pulses, each of the first and second pulse trains having a fixed duty cycle, the fixed duty cycle of the first and second pulse trains being different; and an output node for supplying the bias voltage to the photodiode, wherein the processor is configured to modulate the pulse-width modulated output such that the first pulse train alternates with the second pulse train, and such that a magnitude of the bias voltage is dependent on a ratio of a length of the first pulse train to a length of the second pulse train.

BRIEF DESCRIPTION OF THE DRAWINGS

Further features and advantages of the present invention will become apparent from the following detailed description, taken in combination with the appended drawings, in which.

DETAILED DESCRIPTION

Figure 4:
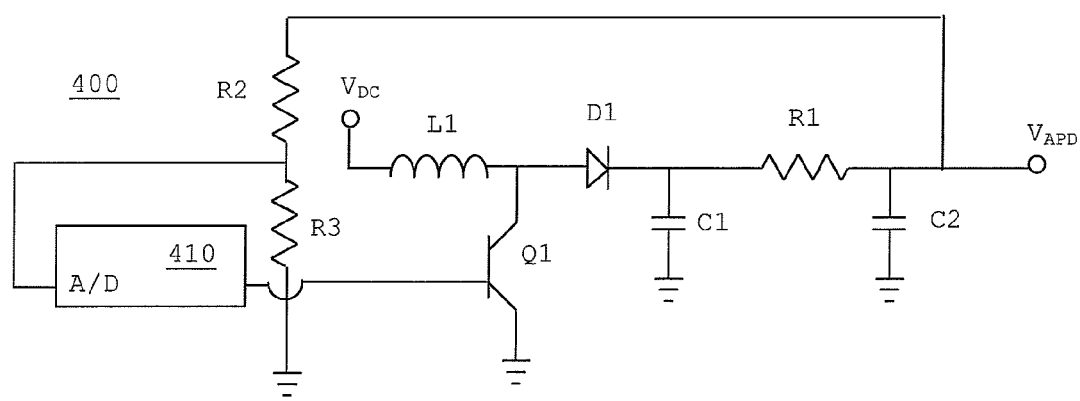
FIG. 4 is a circuit diagram of a high voltage bias circuit used in an optical transceiver and/or optical receiver in accordance with one embodiment of the instant invention.

Referring to FIG. 4, there is shown a high voltage bias circuit in accordance with one embodiment of the instant invention. The high voltage bias circuit 400 includes a FET switch Q1, an inductor L1, a diode D1, resistors R1, R2, and R3, and capacitors C1 and C2. A processor 410 is coupled to the FET switch Q1 and between the two resistors R2 and R3. Preferably, the processor 410 is a microprocessor or a microcontroller having an on-chip PWM unit. Alternatively, the processor is a DSP.

In operation, a module power supply (not shown) supplies an input voltage $V_{DC}$. When the FET Q1 is switched on, energy is stored in the inductor L1, while the diode D1 prevents the capacitor C1 from discharging to ground. When the FET Q1 is switched off, a voltage reversal is induced so that the energy stored in the inductor L1 is discharged, is rectified by the diode D1, is stored by the capacitor C1, and is filtered by resistor R1 and capacitor C2. The processor 410 provides a stream of pulses from its on-chip PWM unit in order to maintain a constant switching frequency of the switch Q1. As multiple cycles are completed, additional charge is built up on the capacitor C1 until a limited amount of current is supplied at the higher voltage $V_{APD}$.

The magnitude of the high bias voltage $V_{APD}$ is controlled by varying the duty cycle of the pulses (i.e., the width or duration of a pulse divided by a full cycle period). More specifically, a control loop, which is implemented entirely inside the processor 410, is used to determine the duty cycle needed to maintain a constant bias voltage $V_{APD}$ under operation condition changes. Feedback to the control loop is provided by sensing the bias voltage via the voltage divider formed from R2 and R3. Notably, the voltage divider also protects the processor 410 against damage from the high voltage generated by the flyback circuit formed from Q1, L1, D1, and C1.

The APD's average current draw, which is also known as the photocurrent, is also determined by the processor 410. More specifically, the loading is determined by monitoring the pulse width of the modulated PWM pulses, which is set by the control loop implemented in the processor. The pulse width is proportional to the current draw from the high voltage bias supply and thus is also proportional to the input optical power of the APD.

Figure 1:
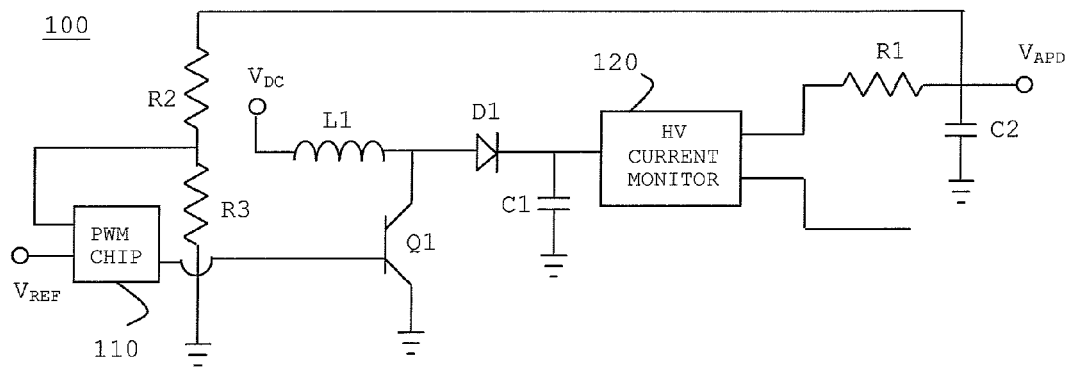
FIG. 1 is a circuit diagram of a typical high voltage bias circuit used in an optical transceiver and/or optical receiver.
Figure 2:
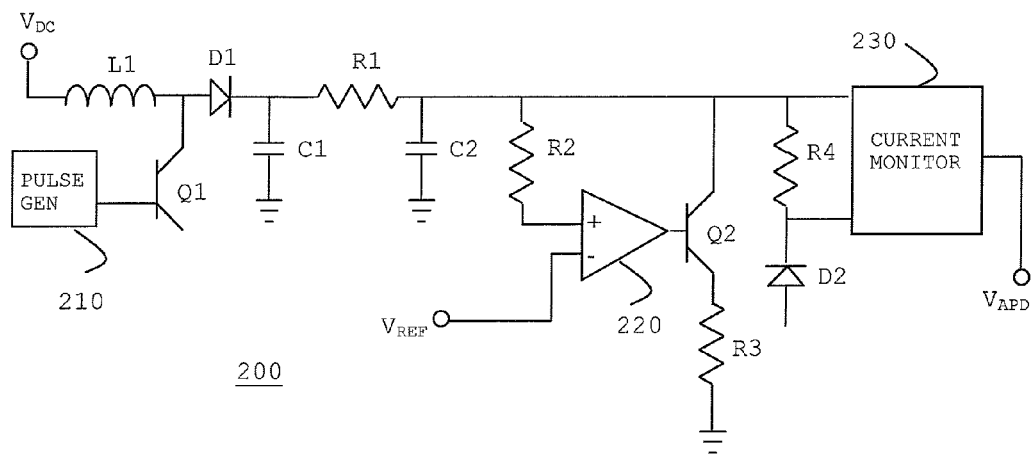
FIG. 2 is a circuit diagram of another high voltage bias circuit used in an optical transceiver and/or optical receiver.
Figure 3:
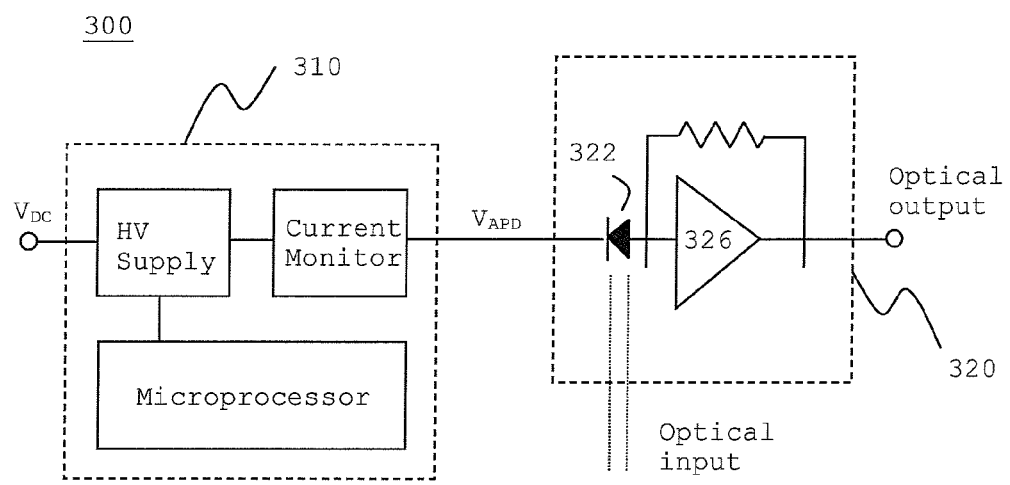
FIG. 3 is a block diagram of a typical optical receiver.

Notably, the high bias circuit illustrated in FIG. 4 has a reduced component count compared to either of the typical circuits shown in FIGS. 1 and 2. In particular, the circuit illustrated in FIG. 4 uses a microprocessor or microcontroller to perform the functions of the PWM chip shown in FIG. 1, the external pulse generator shown in FIG. 2, and/or the current monitor shown in FIGS. 1 and 2. Since the high voltage bias circuits shown in FIGS. 1 and 2 are already designed to couple to a microprocessor or microcontroller, a significant reduction in the number of components results. This reduced component count provides improved component packing density and makes the corresponding receiver/transceiver modules more compact, manufacturable, and cost effective.

Another advantage provided by the instant invention is that both current monitoring and voltage regulation control are implemented in software rather than with hardware. Using software to monitor current and/or control the voltage obviates variations arising from tolerances of the hardware, and thus provides greater accuracy.

However, while software-implemented current monitoring and voltage regulation control are accurate, the resolution of the same is limited by the on-chip PWM unit. In particular, the resolution is limited by the fact that the duty cycle of pulses provided by on-chip PWM unit can only be varied through a finite set of values M, and consequently, the bias voltage can also only be stepped through a finite number of voltage steps M.

In order to achieve the resolution needed to support the current measurement accuracy requirements of the high voltage supply, the PWM should run in excess of 200 MHz. Unfortunately, this requires a microprocessor or microcontroller that is prohibitively expensive to use in most optical transceivers and/or receivers. In fact, most optical transceivers and/or receivers currently use low-end microprocessors where the PWM runs about 25 MHz. These microprocessors provide PWM duty cycle steps that are insufficient to use in the bias voltage control of a photodetector.

According to the instant invention, the voltage resolution provided by low-end microprocessors is enhanced by modulating the processor PWM output between two different duty cycle values. For example, according to one embodiment the microprocessor provides pulse streams in which the duty cycle changes after a predetermined number of cycles from its current value N to an adjacent value N+1 (or alternatively N−1). Since the high voltage bias circuit of the instant invention responds to the average duty cycle value, a voltage output between the voltage associated with N and the voltage associated with N+1 (or N−1) is obtained. The exact magnitude is dependent on the number of PWM cycles produced at duty cycle N and the number of PWM cycles produced at N+1 (or N−1).

Figure 5:
FIG. 5 is a schematic diagram of trains of PWM pulses having different duty cycles.
Figure 5:

This modulated PWM technique is described in more detail with regards to FIG. 5, which shows two different waveforms having adjacent duty cycle values. For exemplary purposes, these waveforms originate from a PWM unit that provides 16-bit resolution and that allows the pulse width to be incrementally changed by 1/65536 of its period (i.e., M=65536).

Referring to the top of FIG. 5, the first waveform is shown to have a pulse width equal to $2/16$ of its period, while the second waveform shown at the bottom of FIG. 5 has a pulse width equal to $3/16$ of its period. In accordance with one embodiment of the instant invention, the PWM output from the processor PWM unit is modulated such that each PWM cycle includes at least one count with a duty cycle value similar to the first waveform and at least one count with a duty cycle value similar to the second waveform. The DC voltage is dependent on the number of counts corresponding to the first duty cycle value and the number of counts corresponding to the second duty cycle value. For example, if the PWM is modulated such that one cycle includes 15 counts of case 1 and one count of case 2, then the average DC output voltage is proportional to $$V_{DC} = \frac{\frac{2}{16}(15) + \frac{3}{16}(1)}{16} \approx \frac{2.1}{16}$$

Alternatively, if the PWM is modulated such that there are 8 counts of case 1 and 8 counts of case 2, then the average DC output voltage is proportional to $$V_{DC} = \frac{\frac{2}{16}(8) + \frac{3}{16}(8)}{16} = \frac{2.5}{16}$$

Notably, these intermediate output voltages are only achieved because of the PWM modulation. Additional output voltages corresponding to those between $2/16$ and $3/16$ are obtained by selecting a different ratio of counts of case 1 to counts of case 2. Alternatively, output voltages corresponding to those between $2/16$ and $3/16$ are obtained by selecting different ratios of counts from pulse streams having duty cycle values differing by more than 1 (i.e., non-adjacent). For example, according to one embodiment the PWM output is modulated such each PWM cycle provides at least a first train of pulses having a duty cycle value N and a second train of pulses having a duty cycle value N+2. Using non-adjacent duty cycle values advantageously offers even finer resolution. In other words, although the duty cycle is still only stepped through a finite set of values M, the obtainable number of bias voltages is closer to being infinite.

In practice, repeatedly alternating between two pulse streams (as discussed above) often produces a beat note in the high bias voltage. Conveniently, the frequency of this beat note is high enough to be largely filtered out by capacitors C1 and C2. Nonetheless, it is advantageous to reduce or redistribute the sinusoidal energy produced by the modulation by allowing the modulation to be randomized over a number of PWM cycles. For example according to one embodiment, counts corresponding to first and second duty cycle values are selected in a random fashion over a number of PWM cycles, such that the ratio of the number of counts corresponding the first duty cycle value and the number of counts corresponding to the second duty cycle value is still proportional to the predetermined voltage difference. Randomly choosing between the first and second counts over a predetermined sub-interval of time (e.g., a cycle), instead of using a regular predetermined pattern of pulse streams, causes the energy of the pulses to be shifted by $e^{jwt}$, where w is the frequency and t is the time. This results in the energy of the sinusoidal modulation being distributed over a bandwidth proportional to the randomization bandwidth. Accordingly, the bandwidth of the energy becomes the classical $\sin(x)/x$ spectrum of a random pulse train. The $\sin(x)/x$ distribution eases the filter requirements on the voltage output of the flyback circuit and reduces the level of the spurious modulation element for a given filter.

While the high voltage bias circuit illustrated in FIG. 4 is shown having a node for coupling to an APD, the circuit is also valuable for biasing PIN photodiodes and for providing an accurate measure of their corresponding received optical power.

Of course, the embodiment of the invention described above is intended to be exemplary only. The scope of the invention is therefore intended to be limited solely by the scope of the appended claims.

What is claimed is:

1. A method of biasing a photodiode used in an optical receiver or optical transceiver comprising:
coupling the photodiode to an electronic circuit, the electronic circuit controlled by a processor;

generating a bias voltage using the electronic circuit by modulating pulse-width modulated pulses generated by the processor between two different duty cycle values, and calculating a photocurrent of the photodiode using an average pulse width of the modulated pulse-width modulated pulses.

2. A method of biasing a photodiode according to claim 1, wherein modulating the pulse-width modulated pulses between two different duty cycle values comprises providing a first train of pulse-width modulated pulses having a first duty cycle and a second train of pulse-width modulated pulses having a second other duty cycle.

3. A method of biasing a photodiode according to claim 2, wherein a magnitude of the generated bias voltage is controlled by selecting a length of each of the first and second pulse trains.

4. A method of biasing a photodiode according to claim 1, wherein modulating the pulse-width modulated pulses between two different duty cycle values comprises randomly selecting between the two different duty cycle values over a plurality of sub-intervals.

5. A method of biasing a photodiode according to claim 4, wherein calculating a photocurrent of the photodiode comprises integrating pulse width of the modulated pulse-width modulated pulses over the plurality of sub-intervals.

6. A method of biasing a photodiode according to claim 4, wherein coupling the photodiode to the electronic circuit comprises coupling the photodiode to an electronic circuit including an input node for receiving an input voltage, an output node for supplying the bias voltage to the photodiode, an inductor having a first end coupled to the input node, a diode having a first end coupled to a second end of the inductor, first and second capacitors coupled to a second end of the diode, a first resister disposed between the first and second capacitors, second and third resistors coupling the output node to the processor, and a switching transistor coupled to both the processor and the inductor.

7. A method of biasing a photodiode according to claim 1, wherein coupling the photodiode to the electronic circuit comprises coupling the photodiode to an electronic circuit including an input node for providing an input voltage, an output node for supplying the bias voltage to the photodiode, an inductor having a first end coupled to the input node, a diode having a first end coupled to a second end of the inductor, first and second capacitors coupled to a second end of the diode, a first resister disposed between the first and second capacitors, second and third resistors coupling the output node to the processor, and a switching transistor coupled to both the processor and the inductor.

8. A method of biasing a photodiode according to claim 1, wherein calculating a photocurrent of the photodiode comprises the processor using the average pulse width and an output voltage.

9. An apparatus for biasing a photodiode used in an optical receiver or optical transceiver comprising:
an electronic circuit for generating a bias voltage for the photodiode, the bias voltage higher than an input voltage; and
a processor including a pulse-width modulation unit coupled to the electronic circuit, the processor including a program for modulating pulse-width modulated pulses generated by the processor between two different duty cycle values and a program for calculating a photocurrent of the photodiode using an average duty cycle of the modulated pulse-width modulated pulses.

10. An apparatus as defined in claim 9, wherein the electronic circuit includes an input node for receiving the input voltage, an output node for supplying the bias voltage to the photodiode, an inductor having a first end coupled to the input node, a diode having a first end coupled to a second end of the inductor, first and second capacitors coupled to a second end of the diode, a first resister disposed between the first and second capacitors, second and third resistors coupling the output node to the processor, and a switching transistor coupled to both the processor and the inductor.

11. An apparatus as defined in claim 9, wherein the photodiode is an APD.

12. An apparatus as defined in claim 9, wherein the photodiode is a PIN diode.

13. An apparatus as defined in claim 9, wherein the processor includes a program for controlling and regulating the bias voltage via the modulation of the pulse-width modulated pulses.

14. An apparatus as defined in claim 10, wherein the processor includes a program for controlling and regulating the bias voltage via the modulation of the pulse-width modulated pulses.

15. An apparatus as defined in claim 11, wherein the processor includes a program for controlling and regulating the bias voltage via the modulation of the pulse-width modulated pulses.

16. An apparatus for biasing a photodiode used in an optical receiver or optical transceiver comprising:
an input node for providing an input voltage;
electronic circuitry coupled to the input node for generating a bias voltage that is higher than the input voltage, the electronic circuitry controlled by a processor that has a pulse-width modulated output, the pulse-width modulated output including a first train of pulse-width modulated pulses and a second train of pulse-width modulated pulses, each of the first and second pulse trains having a fixed duty cycle, the fixed duty cycle of the first and second pulse trains being different; and
an output node for supplying the bias voltage to the photodiode,
wherein the processor is configured to modulate the pulse-width modulated output such that the first pulse train alternates with the second pulse train, and such that a magnitude of the bias voltage is dependent on a ratio of a length of the first pulse train to a length of the second pulse train, and wherein the processor is configured to provide an indication of a photocurrent of the photodiode by monitoring the modulated pulse-width modulated output.

17. An apparatus for biasing a photodiode according to claim 16, wherein the processor is configured to modulate the pulse-width modulated output randomly over a plurality of pulse-width modulated cycles.

* * * * *